United States Patent [19]
Fowler

[11] Patent Number: 5,872,538
[45] Date of Patent: Feb. 16, 1999

[54] FREQUENCY DOMAIN CORRECTION OF I/Q IMBALANCE

[75] Inventor: Mark L. Fowler, Ithaca, N.Y.

[73] Assignee: Lockheed Martin Corporation, Bethesda, Md.

[21] Appl. No.: 30,849

[22] Filed: Feb. 26, 1998

[51] Int. Cl.[6] .................................................. G01S 7/40
[52] U.S. Cl. ............................................................ 342/194
[58] Field of Search .................................. 342/194, 174, 342/165; 455/295, 63

[56] References Cited

U.S. PATENT DOCUMENTS

| | | | |
|---|---|---|---|
| 3,950,750 | 4/1976 | Churchill et al. | 342/194 |
| 4,003,054 | 1/1977 | Goldstone | 342/194 |
| 4,122,488 | 10/1978 | Martin | 342/194 |
| 4,484,194 | 11/1984 | Arvidsson | 342/194 |
| 4,489,392 | 12/1984 | Lewis | 342/194 |
| 4,616,229 | 10/1986 | Taylor, Jr. | 342/194 |
| 4,876,489 | 10/1989 | Cawthorne | 342/194 |
| 5,105,195 | 4/1992 | Conrad | 342/194 |
| 5,150,128 | 9/1992 | Kongelbeck | 342/194 |
| 5,369,411 | 11/1994 | Lisle, Jr. | 342/194 |

Primary Examiner—Daniel T. Pihulic
Attorney, Agent, or Firm—Whitham, Curtis & Whitham

[57] ABSTRACT

I/Q imbalance correction is performed directly in the frequency domain by exploiting the symmetry properties of the discrete Fourier transform (DFT) of a real signal, taking the in-phase component as the real part and the quadrature component as the imaginary part. Amplitudes of ordered real and imaginary spectral components are respectively summed with reverse-ordered real and imaginary spectral components, the sums complex multiplied with correction values derived through calibration and selected in accordance with a maximum magnitude spectral component and the results of the complex multiplication summed with the real and imaginary spectral components. Simplified processing architecture and improved performance for a given level of processing power is thus provided.

20 Claims, 1 Drawing Sheet

FREQUENCY DOMAIN CORRECTION OF I/Q IMBALANCE

BACKGROUND OF THE INVENTION

1. Field of the Invention

The present invention generally relates to electromagnetic (e.g. radio) signal detection and processing and, more particularly, to correction for unavoidable differences between electronic components in separate analog channels for processing in-phase (I) and quadrature (Q) portions of the detected signal.

2. Description of the Prior Art

There are numerous applications, including passive ranging and radar applications as well as radio communications in which it is desirable to detect a signal of a frequency which is not initially known but which lies within a given frequency band. For such detection, analog filtering in accordance with the given frequency band is, of course, well-known. However, at the present state of the art, digital signal processing for filtering is also well-known and generally preferred, where feasible, in view of the relative flexibility of modification of the processing by suitable programming of a digital data processor and the precision with which digitized signals can be processed.

Unfortunately, for digital signal detection over a frequency band by digital processing, a wide frequency band for detection requires a correspondingly high sampling frequency. A high sampling frequency increases the amount of data which must be digitally processed and increases hardware overhead, cost, size and weight while potentially compromising response time, depending on available data processor capacity or power. Therefore, as a practical matter, analog signal processing for signal detection and filtering may remain the technique of choice for a given application or device design, particularly when the device must monitor a broad frequency band. It should also be appreciated that even when analog signal processing is utilized for detection, filtering and/or any other desired processing, conversion of the data to digital form for additional processing may be done at any point at which digital processing becomes relatively more desirable or convenient.

In many of the applications alluded to above, the received signal is often converted into an in-phase (I) component and a quadrature (Q) component which are simultaneously processed in parallel in respective signal channels. When analog signal processing circuits are employed to generate the I and Q signals, unavoidable variations between individual electrical components in the respective channels, in the aggregate, cause variations in response between the channels (thus referred to as I/Q imbalances) which are frequency dependent and largely unpredictable.

As is known, such imbalances may take the form of amplitude imbalance, phase imbalance and/or DC offset. DC offset is manifested in the production of an image signal at the center of the band of interest and can thus be corrected or compensated with relative ease since the band of interest will define the center frequency. However, combinations of amplitude and phase imbalance are manifested as an image frequency reflected about the center frequency of the frequency band from the received signal, the frequency of which is not necessarily known.

The amplitude of the image signal is a function of the magnitude of the amplitude and phase imbalances and, although it will be less than the amplitude of the received signal, may be significant. Both amplitude and phase imbalance are frequency dependent and, while correction values for correcting such imbalances can be determined by careful calibration of the detector, receiver or other circuit including the parallel, analog I and Q channels, the proper correction values cannot be chosen and applied without knowledge of the frequency of the received signal. If the I and Q data is digitized and subsequently processed without correction or compensation for the image signal, the image signal data will be included in the digitized representation thereof and thereafter will be inseparable from the received signal. The image signal can thus degrade the performance of algorithms used to estimate the parameters of the received signal, appear as an additional signal which requires separate processing and/or mask the existence of a weaker signal which may also be of interest.

Techniques are known for correction of I/Q imbalances using digital signal processing techniques applied to digitized versions of the I and Q signals such as that described in "The Correction of I and Q Errors in a Coherent Processor" By Churchill et al., IEEE Trans. Aerospace and Electronics, January, 1981, pp. 131–137 and U.S. Pat. No. 3,950,750. An improved implementation of the technique disclosed by Churchill et al. is disclosed in U.S. Pat. No. 5,105,195 to Conrad in which a known test signal is periodically applied for calibration and computation of correction factors which are fed back to a compensation circuit.

However, these techniques are applied in the time domain and, since the correction to be applied is frequency dependent, some additional technique of determining the frequency of the received signal is needed but may not be readily available, as in the applications alluded to above where the frequency of the received signal is initially unknown. In addition, the implementation of Conrad does not provide the ability to compensate at a plurality of frequencies, as is essential in many application areas.

To obtain frequency information concerning the detected signal, it is possible to compute the discrete Fourier transform (DFT) of the signal by performing a fast Fourier transform (FFT), determining the frequency of the dominant signal and then applying the appropriate frequency-dependent corrections to the time-domain signal. However, if further frequency domain processing is to be done on the corrected signal, as is often desirable, a further FFT must be performed on the corrected time domain signal to obtain a representation of the signal in the frequency domain for such further processing. Thus, two FFTs are required to achieve frequency-dependent correction for I/Q imbalance by the known techniques described above and, thereafter, to allow further frequency domain processing of the signal to be accomplished.

For example, the detection of multiple continuous wave (CW) signals and correlation processing for frequency and phase estimation which is often encountered in position locating or ranging systems requires additional frequency domain processing and possibly further I/Q imbalance correction for additional detected frequencies. Such further I/Q imbalance correction by the above-described techniques would require further pairs of FFTs to be performed which may be beyond the capacity of special purpose FFT processors which are otherwise feasible for use in a particular application, particularly if a high sampling rate must be provided by the design.

An early attempt to provide frequency domain I/Q imbalance correction is disclosed in U.S. Pat. No. 4,003,054 to Goldstone. However, the approach disclosed therein requires the application of a plurality of linear chirp signals, each covering a different frequency band to compute a set of frequency-dependent correction factors equally spaced across the frequency band of interest. As with the time domain correction of Conrad, the requirement for a particular calibration signal to be applied does not provide a generalized system for correction. Linear chirp signals, in particular, while used in modern radar systems, are not available in many applications for which I/Q imbalance correction may be desired.

Further, Goldstone applies all of the correction factors to the FFT of a received signal which can be computationally intensive when processing using large FFT sizes and does not assure that the frequencies for which correction factors are available closely coincide with the frequency of the received signal of interest. That is, the development of equally spaced correction factors across the frequency band of interest is a constraint which limits optimization of performance in regard to an arbitrary frequency of a signal for a given implementation complexity. In addition, when the signal is, for example, a narrowband CW signal concentrated in a very small region of the entire frequency band being processed, applying correction factors over the entire frequency band (as is done in Goldstone) can degrade the performance of subsequent processing.

Accordingly, there is a need for a technique of I/Q imbalance correction employing simplified calibration signals which can be carried out in the frequency domain when the frequency of the received signal is not initially known, and is well-suited to processing narrowband CW signals.

SUMMARY OF THE INVENTION

It is therefore an object of the present invention to provide a technique for providing I/Q imbalance correction in the frequency domain using simple sinusoidal signals and without constraint on the nature of the signal detected or used for calibration.

It is another object of the invention to provide a computationally simplified technique of providing I/Q imbalance correction.

It is a further object of the invention to provide for improved received signal detection in combination with arbitrary frequency domain signal processing.

It is yet another object of the invention to provide a practical alternative to digital signal processing for generation of the I/Q components of a signal of unknown frequency within a wide band of frequencies.

In order to accomplish these and other objects of the invention, a method and apparatus are provided for converting a group of N samples of each of the I and Q time-domain signals to a frequency-domain representation thereof comprising N real and N imaginary components, respectively, summing each kth real component with each (N−k)th real component, summing each kth imaginary component with each (N−k)th imaginary component, selecting a component of the frequency domain representation of the signal at a selected frequency, complex multiplying respective results of the summing steps by respective correction values corresponding to the selected frequency, and summing respective results of the complex multiplying step with the N real and the N imaginary components to provide I/Q imbalance corrected frequency domain signals.

BRIEF DESCRIPTION OF THE DRAWINGS

The foregoing and other objects, aspects and advantages will be better understood from the following detailed description-of a preferred embodiment of the invention with reference to the drawings, in which.

DETAILED DESCRIPTION OF A PREFERRED EMBODIMENT OF THE INVENTION

Figure 1:
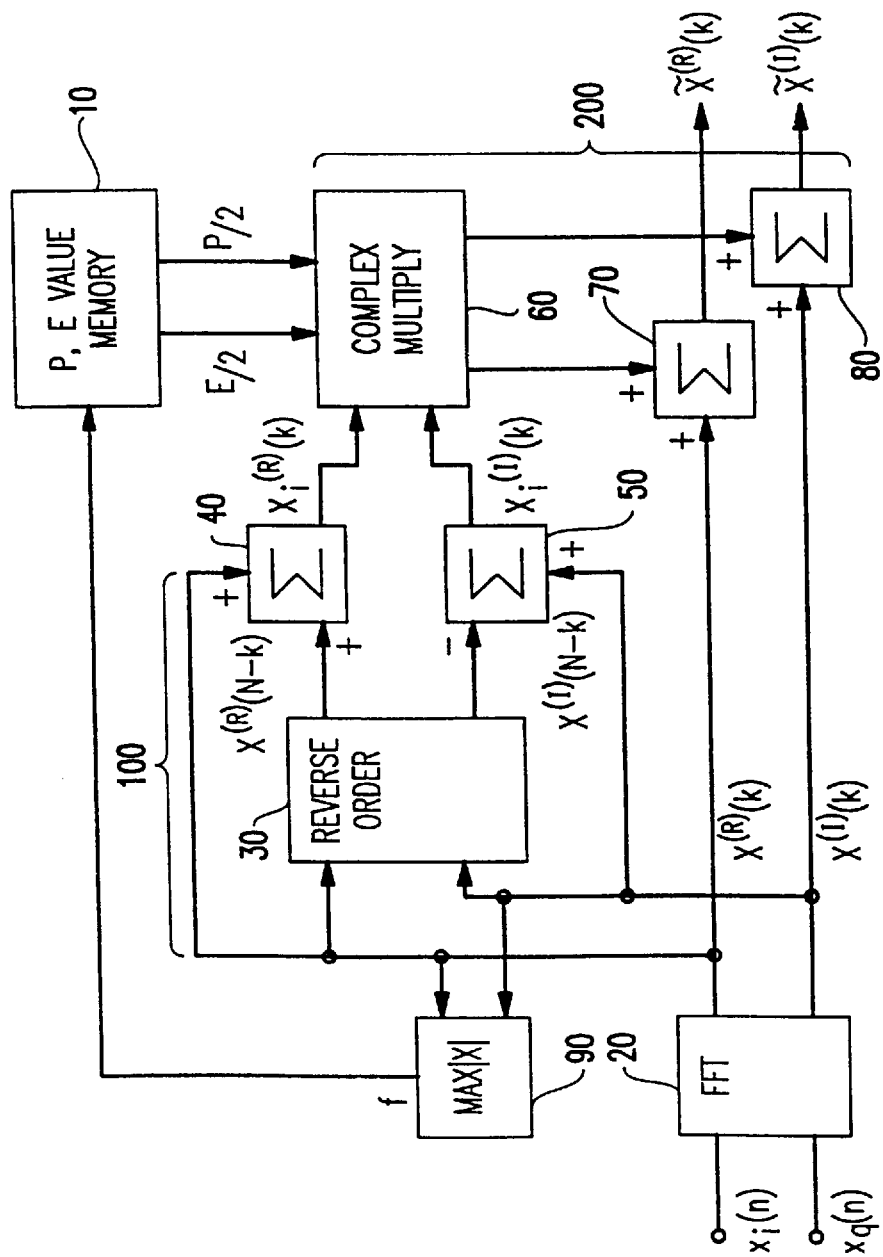
FIG. 1 is a block diagram of a signal processing circuit for performing I/Q imbalance correction in accordance with the invention.

Referring now to the drawings, and more particularly to FIG. 1, there is shown a block diagram of a signal processing circuit for performing I/Q imbalance correction in accordance with the invention. As alluded to above, a memory structure 10 is provided to store correction values, P, E, which are empirically derived by calibration of the individual detector, receiver, demodulator or other apparatus in which the invention may be used. A single fast Fourier transform processor 20 is also provided to convert the time-domain signals received to a frequency domain representation thereof. As shown, the input to FFT processor 20 is provided with time-domain I and Q signals $x_i(k)$ and $x_q(k)$ which are assumed to have been already separated from the received signal in an analog fashion (thus containing an I/Q imbalance) and digitized. It will be helpful to an understanding of the invention to note that the remainder of FIG. 1 is divided generally into two functional sections 100, 200; each of which is arranged to perform a particular computation as will be discussed in greater detail below.

The technique and apparatus in accordance with the invention is to makes use of symmetry properties of the discrete Fourier transform (DFT) of a real signal to allow direct computation of the DFT of the I component of the digitized time-domain signal from the DFT of the complex signal formed by taking the I component of the digitized complex frequency-domain signal as the real part and the Q component as the imaginary part. This allows I/Q imbalance correction to be done in the frequency domain using a single complex FFT.

Once the I and Q signals have been generated in an analog fashion and, thereafter, individually digitized, the signal is represented as a complex-valued signal having the I component as the real part and the Q component as the imaginary part or, explicitly, $$x(n)=x_i(n)+jx_q(n). \qquad (1)$$

Accordingly, the DFT of x(k) is $$X(k)=X_i(k)+jX_q(k), \qquad (2)$$

where $X_i(k)$ and $X_q(k)$ are each complex-valued. That is:

$$X_i(k)=X_i^{(R)}(k)+jX_i^{(I)}(k), \text{ and} \qquad (3)$$

$$X_q(k)=X_q^{(R)}(k)+jX_q^{(I)}(k), \qquad (3a)$$

where the superscript (R) denotes the real part and the superscript (I) denotes the imaginary part.

In the time domain, distinguishing the I and Q components is straightforward because the real and imaginary parts are stored separately. However, when the DFT of x(k) is taken, a difficulty arises because the I and Q components each have real and imaginary parts in the frequency domain. However, the fact that the real part of the DFT of a real valued signal has even symmetry and the imaginary part of the DFT of a real valued signal has odd symmetry can be exploited to distinguish between the real and imaginary components in accordance with the invention.

Specifically, the even symmetry property of the real part of the DFT of a real valued signal results in $$X_i^{(R)}(k)=X_i^{(R)}(N-k) \tag{4a}$$

$$X_q^{(R)}(k)=X_q^{(R)}(N-k), \tag{4b}$$

where N is the length of the DFT, and the odd symmetry property of the imaginary part of the DFT of the same signal results in $$-X_i^{(I)}(k)=X_i^{(I)}(N-k) \tag{4c}$$

$$-X_q^{(I)}(k)=X_q^{(I)}(N-k) \tag{4d}$$

Combining Equation (2) with Equations (3a) and (3b) yields $$X(k)=[X_i^{(R)}(k)-X_q^{(I)}(k)]+j[X_i^{(I)}(k)+X_q^{(R)}(k)] \underline{\Delta} X^{(R)}(k)+jX^{(I)}(k) \tag{5}$$

Now, applying the symmetry relations of Equations (4a) to (4d) to Equation (5) yields $$X(N-k)=[X_i^{(R)}(k)+X_q^{(I)}(k)]+j[-X_i^{(I)}(k)+X_q^{(R)}(k)] \underline{\Delta} X^{(R)}(N-k)+jX^{(I)}(N-k) \tag{6}$$

The real and imaginary parts of Equations (5) and (6) can be combined in various ways to isolate $X_i(k)$ and $X_q(k)$:

$$X_i(k) = \frac{1}{2}[X^{(R)}(k)+X^{(R)}(N-k)]+\frac{j}{2}[X^{(I)}(k)-X^{(I)}(N-k)] \tag{7a}$$

$$X_q(k) = \frac{1}{2}[X^{(I)}(k)+X^{(I)}(N-k)]+\frac{j}{2}[X^{(R)}(N-k)-X^{(R)}(k)] \tag{7b}$$

Equations (7a) and (7b) thus show how to separate $X(k)$ into $X_i(k)$ and $X_q(k)$ which can be directly utilized to provide frequency-domain I/Q imbalance correction as will now be discussed.

The time-domain technique for correction as described in the Churchill et al. article cited above is given by $$\tilde{x}_i(n)=Ex_i(n)+x_i(n)$$

$$\tilde{x}_q(n)=x_q(n)+Px_i(n) \tag{8}$$

where $\tilde{x}_i(n)$ and $\tilde{x}_q(n)$ are the corrected I and Q signals, respectively, and where E and P are correction factors that are stored in memory. In the frequency domain, the DFTs of Equation (8) give $$\tilde{X}_i(k)=EX_i(k)+X_i(k)$$

$$\tilde{X}_q(k)=X_q(k)+PX_i(k) \tag{9}$$

Then, the corrected DFT, $\tilde{X}(k)$, is given by $$\tilde{X}(k)=\tilde{X}_i(k)+j\tilde{X}_q(k) \tag{10}$$

However, as alluded to above, computing the corrected DFT in the time domain and then returning to the frequency domain by performing a second fast Fourier transform carries a significant computational burden and may be beyond the capacity of even special purpose FFT processors which could be used in a particular application or device design if high sampling rates are required. Accordingly, the invention provides a much simplified technique for deriving a signal corrected for I/Q imbalance directly in the frequency domain.

Specifically, substituting Equation (9) into Equation (10) yields $$\tilde{X}(k) = EX_i(k) + X_i(k) + j[X_q(k) + PX_i(k)] \tag{11}$$
$$= EX_i(k) + X_i(k) + jX_q(k) + jPX_i(k)$$

Now, using the fact that the middle two terms on the second line of Equation (11) combine to give $X(k)$, the corrected DFT, $\tilde{X}(k)$, is given by $$\tilde{X}(k)=X(k)+(E+jP)X_i(k) \tag{12}$$

Thus, computation of only Equation (7a), but not (7b), is required and can be accomplished in a simplified fashion in accordance with the invention, which exploits the symmetry properties alluded to above.

Specifically and returning to FIG. 1, the FFT processor 20 converts a block of N time domain received signal samples $x_i(k)$, $x_q(k)$ to a frequency domain representation thereof, $X^{(R)}(k)$, $X^{(I)}(k)$, as shown. These signals are buffered in a suitable storage arrangement depicted at 30 to reverse the order thereof within the block as indicated by the notations $X^{(R)}(N-k)$ and $X^{(I)}(N-k)$. The reverse ordered samples are then summed with the samples as originally ordered at adders 40, 50, to provide $X_i^{(R)}(k)$ and $X_i^{(I)}(k)$, both of which are real valued, to complete the computation of Equation (7a) in portion 100 of FIG. 1.

The correction of the I/Q imbalance is achieved, in accordance with the preferred embodiment of the invention, by similarly simplified processing in portion 200 of FIG. 1. First, the maximum absolute value of the frequency domain signals among the N samples is discriminated to determine the dominant frequency of the received signal, as indicated at 90. The frequency of the dominant signal, thus determined, (or any other frequency which may be selected), is used to access frequency-dependent correction values P, E, from memory 10 as determined and stored therein from a prior calibration of the receiver, discriminator, demodulator or the like with which the invention is employed.

It should be appreciated that the calibration process is entirely arbitrary as to the frequencies for which correction values are derived and stored. That is, in contrast to the arrangement of Goldstone, discussed above, correction values can be provided for as many frequencies as it may be convenient to store and with no restrictions or constraints on the distribution of the frequencies for which correction values are provided across the frequency band of interest. For example, depending on details of the design of the I and Q channels of the receiver, demodulator or the like which affects variation of I/Q imbalance with frequency, and the expected distribution of the frequencies of received signals, i.e., a higher priority or importance may be placed on processing signals in certain frequency regions within the overall frequency range considered, it may be desirable to provide more densely spaced correction values in some sub-bands than in others.

In any event, if correction values are not initially provided for a frequency sufficiently close to the frequency of the peak received signal, the device may be quickly and simply recalibrated to provide additional correction values for any particular frequency from a sinusoidal waveform which is likely to be available (e.g. from a frequency synthesizer in the receiver) in the device. Thus, the I/Q imbalance correction system in accordance with the invention is fully generalized to all types of signals (e.g. CW, radar and the like) and does not require any particular signal type for calibration. Furthermore, the time or overhead for any such recalibration that may be desired is necessarily small in comparison with the implementation of either Conrad or Goldstone discussed above.

With more specific reference to FIG. 1, once the correction values P and E corresponding to a particular frequency are retrieved from memory (or developed by re-calibration, whether or not stored prior to utilization) a multiplication of the complex values output by adders/summing circuits 40 and 50 by the correction values can be performed by a complex number multiplication circuit 60. Integrated circuit special purpose logic array processors, referred to generically as "macros", are commercially available for performance of such a function. Summing these values with the digitized output of FFT processor 20 then completes the computation of Equation (9) or (12) above to complete the I/Q imbalance correction.

It should be appreciated in this particular regard that only a single pair of correction values is applied to the respective terms of the Discrete Fourier Transform and the computation can be carried out extremely rapidly in comparison to, for example, the Goldstone implementation in which all of the correction values are applied to respective terms of the FFT. In accordance with the invention, of course, if other frequencies are found to be present after the I/Q imbalance processing described above, further I/Q imbalance corrections can be made sequentially on selected individual frequency or frequencies, as may be desired, preferably in decreasing order of magnitude of the spectral component of the received signal. Improved performance is thus facilitated for whatever frequencies I/Q imbalance correction may be considered useful since the process of individual frequency correction can be terminated at any arbitrary magnitude of spectral component. Accordingly, larger numbers of samples and wider frequency bands can be accommodated by the invention than can be processed in a comparable amount of time by any previously known technique.

The procedure in accordance with the invention, described above, is an improvement over the technique published by Churchill et al. because the technique of Churchill does not allow the application of a frequency dependent correction. Furthermore, the approach in accordance with the invention is well suited to subsequent frequency domain processing (such as detection of multiple CW signals) since the correction is applied directly in the frequency domain.

In view of the foregoing, it is seen that the invention provides a simplified and generalized technique for providing I/Q imbalance directly in the frequency domain. The invention thus provides much improved performance for a given level of processing power consistent with further arbitrary frequency-domain signal processing and provides a practical alternative to digital processing for generating the I/Q components of a signal of unknown frequency within a wide frequency band.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for performing I/Q imbalance correction of a time-domain signal in the frequency domain comprising the steps of
   calibrating a device for analog generation of I and Q time-domain signals to derive a plurality of correction values at a plurality of respective frequencies,
   converting a group of N samples of each of said I and Q time-domain signals to a frequency-domain representation thereof comprising N real and N imaginary components, respectively,
   summing each kth real component with each (N−k)th real component,
   summing each kth imaginary component with each (N−k)th imaginary component,
   selecting a component of said frequency domain representation of said signal at a selected frequency,
   complex multiplying respective results of said summing steps by respective correction values corresponding to said selected frequency, and
   summing respective results of said complex multiplying step with said N real and said N imaginary components to provide I/Q imbalance corrected frequency domain signals.

2. A method as recited in claim 1, wherein said selecting step includes the step of
   determining a maximum amplitude frequency from said N real and N imaginary components.

3. A method as recited in claim 1, further including the step of
   selecting a further component of said frequency domain representation of said signal at a further selected frequency.

4. A method as recited in claim 2, further including
   selecting a further component of said frequency domain representation of said signal at a further selected frequency.

5. A method as recited in claim 4, wherein said selecting step and said step of selecting a further component respectively comprise steps of
   determining said selected frequency and said further selected frequency in order of descending amplitude of frequency components of said frequency domain representation of said signal.

6. A method as recited in claim 1, wherein said calibration step includes the step of
   applying a sinusoidal signal to said device.

7. A method as recited in claim 6, wherein said selecting step includes the step of
   determining a maximum amplitude frequency from said N real and N imaginary components.

8. A method as recited in claim 6, further including the step of
   selecting a further component of said frequency domain representation of said signal at a further selected frequency.

9. A method as recited in claim 7, further including the step of
   selecting a further component of said frequency domain representation of said signal at a further selected frequency.

10. A method as recited in claim 9, wherein said selecting step and said step of selecting a further component respectively comprise steps of
    determining said selected frequency and said further selected frequency in order of descending amplitude of frequency components of said frequency domain representation of said signal.

11. An apparatus for performing I/Q imbalance correction of a time-domain signal in the frequency domain comprising
    means for calibrating a device for analog generation of I and Q time-domain signals to derive a plurality of correction values at a plurality of respective frequencies,
    means for converting a group of N samples of each of said I and Q time-domain signals to a frequency-domain representation thereof comprising N real and N imaginary components, respectively, means for summing each kth real component with each (N−k)th real component, means for summing each kth imaginary component with each (N−k)th imaginary component, means for selecting a component of said frequency domain representation of said signal at a selected frequency, means for complex multiplying respective results of said summing steps by respective correction values corresponding to said selected frequency, and means for summing respective results of said complex multiplying step with said N real and said N imaginary components to provide I/Q imbalance corrected frequency domain signals.

12. An apparatus as recited in claim 11, wherein said means for selecting includes means for determining a maximum amplitude frequency from said N real and N imaginary components.

13. An apparatus as recited in claim 11, including means for selecting a further component of said frequency domain representation of said signal at a further selected frequency.

14. An apparatus as recited in claim 12, including means for selecting a further component of said frequency domain representation of said signal at a further selected frequency.

15. An apparatus as recited in claim 14, wherein said means for selecting a component and said means for selecting a further component respectively comprise means for determining said selected frequency and said further selected frequency in order of descending amplitude of frequency components of said frequency domain representation of said signal.

16. An apparatus as recited in claim 11, wherein means for said calibration includes means for applying a sinusoidal signal to said device.

17. An apparatus as recited in claim 16, wherein said means for selecting includes means for determining a maximum amplitude frequency from said N real and N imaginary components.

18. An apparatus as recited in claim 16, including means for selecting a further component of said frequency domain representation of said signal at a further selected frequency.

19. An apparatus as recited in claim 17, including means for selecting a further component of said frequency domain representation of said signal at a further selected frequency.

20. An apparatus as recited in claim 19, wherein said means for selecting a component and said means for selecting a further component respectively comprise means for determining said selected frequency and said further selected frequency in order of descending amplitude of frequency components of said frequency domain representation of said signal.

* * * * *